United States Patent [19]

Ohira et al.

[11] Patent Number: 4,698,233

[45] Date of Patent: Oct. 6, 1987

[54] PRODUCTION OF ALUMINUM MATERIAL HAVING AN ALUMINUM NITRIDE LAYER

[75] Inventors: Shigeo Ohira, Ihara; Masaya Iwaki, Wako City, both of Japan

[73] Assignees: Nippon Light Metal Company Limited, Tokyo; Rikagaku Kenkyusho, Wako City, both of Japan

[21] Appl. No.: 872,278

[22] Filed: Jun. 10, 1986

[30] Foreign Application Priority Data

Jun. 24, 1985 [JP] Japan .................................. 60-137625

[51] Int. Cl.$^4$ ............................................. B05D 3/06
[52] U.S. Cl. ..................................... 427/38; 148/20.3; 250/492.3
[58] Field of Search ...................... 204/157.44, 192.31; 148/DIG. 37, DIG. 113, 4, 20.3, 16, 660, 661; 250/492.3, 492.21; 427/38, 39

[56] References Cited

U.S. PATENT DOCUMENTS

| | | | |
|---|---|---|---|
| 3,737,343 | 6/1973 | Basseches et al. | 204/157.44 |
| 3,806,380 | 4/1974 | Kitada et al. | 204/192.31 X |
| 4,383,178 | 5/1983 | Shibata et al. | 250/492.31 X |
| 4,597,808 | 7/1986 | Tachikawa et al. | 148/20.3 |
| 4,629,631 | 12/1986 | Dearnaley | 204/192.31 X |

*Primary Examiner*—John F. Niebling
*Assistant Examiner*—Nam X. Nguyen
*Attorney, Agent, or Firm*—William J. Daniel

[57] ABSTRACT

Process for producing an aluminum material having an aluminum nitride surface layer which comprises implanting the surface of an aluminum substrate with nitrogen ions while maintaining a nitrogen atmosphere under reduced pressure in the vicinity of the surface of the aluminum substrate. The aluminum nitride modified layer contains substantially no impurities such as oxygen. It is a feature of this invention to perform ion implantation in a properly controlled nitrogen atmosphere at a proper degree of vacuum in the range of about $10^{-7}$ to $10^{-5}$ Torr.

6 Claims, 2 Drawing Figures

PRODUCTION OF ALUMINUM MATERIAL HAVING AN ALUMINUM NITRIDE LAYER

BACKGROUND OF THE INVENTION

1. Field of the Invention

The present invention relates to a process for producing an aluminum material having an aluminum nitride thin layer on the surface thereof. The aluminum material is suitable for use as an electronics material and acoustic material.

2. Description of the Prior Art

An aluminum material, with an aluminum nitride thin layer formed thereon, is expected to find use as an electronics material and acoustic material, because aluminum nitride has good electrical insulating properties and yet has good thermal conductivity, and because it exhibits a good propagation of sound.

There are several known processes for forming an aluminum nitride layer on an aluminum substrate. They include, for example, the reactive sputtering process, chemical vapor deposition process, and ion implantation process. The first two processes are designed to form an aluminum nitride thin layer on an aluminum substrate by deposition, and the last process is designed to form an aluminum nitride layer in the very thin surface layer of an aluminum substrate by implanting cationized nitrogen into the surface layer of an aluminum substrate. The ion implantation process has many outstanding features. It provides an aluminum nitride layer which has no effect on the dimensional stability of the aluminum substrate and has good adhesion to the aluminum substrate, because it converts the surface layer of the aluminum substrate into an aluminum nitride layer. In addition, it provides an aluminum nitride layer of comparatively high purity if aluminum of adequate purity is employed as the substrate.

Despite the above-mentioned features, the ion implantation process sometimes provides an aluminum nitride layer of poor quality even though aluminum of high purity is selected as a substrate. This is attributable to a trace amount of residual oxygen and carbon dioxide gas in the vacuum chamber which is evacuated to about $1 \times 10^{-6}$ Torr for the irradiation of accelerated nitrogen ions. These residual gases get penetrate into aluminum during the process.

SUMMARY OF THE INVENTION

It is an object of the present invention to provide a process for producing an aluminum material having an aluminum nitride modified layer which contains no or very little impurities such as oxygen.

In order to achieve this object, the present inventors carried out a series or researches, which led to a finding that an aluminum nitride layer virtually completely free of impurities can be formed if the irradiation of nitrogen ions on an aluminum surface layer is performed in a properly controlled nitrogen atmosphere at a proper degree of vacuum.

The gist of this invention resides in a process for producing an aluminum material having an aluminum nitride layer on the surface thereof which comprises implanting the surface of an aluminum substrate with nitrogen ions while maintaining a nitrogen atmosphere under reduced pressure in the vicinity of the surface of the aluminum substrate.

DETAILED DESCRIPTION OF THE INVENTION

Figure 1:
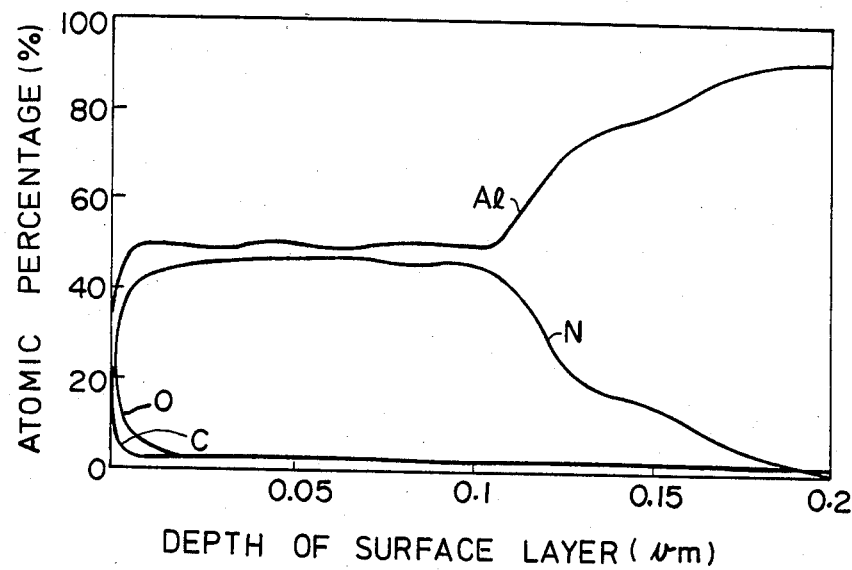
FIG. 1 is a graph showing the relationship between the atomic percentage (A.C.) of its component parts and the depth of the surface layer of an aluminum material obtained in an example of this invention.

According to this invention, the atmosphere in which the aluminum surface is implanted with nitrogen ions is formed by evacuating the vacuum chamber to $1 \times 10^{-7}$ to $1 \times 10^{-6}$ Torr and then permitting nitrogen gas to continuously flow along the aluminum surface, or by introducing a small amount of nitrogen gas into the vacuum chamber evacuated to $1 \times 10^{-7}$ to $1 \times 10^{-6}$ Torr. In either cases, it is important to keep the vacuum chamber below $1 \times 10^{-5}$ Torr despite the introduction of nitrogen gas; otherwise, ion implantation is not performed satisfactorily.

According to this invention, the accelerating energy for nitrogen ion implantation should be in the range of 10 keV to 300 keV, preferably 50 to 200 keV. With lower than 10 keV, ion implantation does not take place to form the aluminum nitride layer. With higher than 300 keV, ion implantation forms nitrogen aluminum of extremely poor crystallinity on the aluminum surface. If ion implantation is performed for an aluminum substrate in the form of a single crystal with the above-specified accelerating energy, the resulting aluminum nitride layer is also in the form of single crystal.

The surface of an aluminum substrate should be implanted with a proper amount of nitrogen ions so that an aluminum nitrogen layer is formed satisfactorily. The amount of nitrogen ions should be greater than $5 \times 10^{17}$ ions/cm$^2$.

As mentioned above, the ion implantation according to the present invention forms an aluminum nitride layer substantially free of impurities such as oxygen in the surface layer of an aluminum substrate. The advantage of this invention is enhanced when the accelerating energy is kept below 300 keV, in which case the resulting aluminum nitride layer has a high purity and good crystallinity.

The aluminum nitride layer formed in the surface layer of an aluminum substrate by the process of this invention has a thickness in the range of 0.1 to 0.5 μm. This extremely thin layer permits a rapid heat transmission to the aluminum substrate. Therefore, the aluminum material having the aluminum nitride layer can be used as an electronics material. In addition, the aluminum nitride layer can be separated from the aluminum substrate when treated with a proper solvent such as bromomethanol. The thus separated layer can used as an aluminum nitride thin film.

Aluminum material having an aluminum nitride layer is superior in hardness, corrosion resistance, and dimensional accuracy to an untreated aluminum material.

The invention is now described with reference to the following examples.

EXAMPLE

The surface of an aluminum substrate measuring 30×30×2.5 mm and having a purity of 99.99% was subjected to nitrogen ion implantation in a vacuum chamber which had previously been evacuated to $1\times10^{-6}$ Torr. During the ion implantation, nitrogen gas was allowed to flow along the surface of the aluminum substrate.

During the ion implantation, the pressure in the vacuum chamber was $1\times10^{-5}$ Torr, the accelerating energy is 100 keV, and the amount of implanted ions was $1\times10^{18}$ ions/cm$^2$.

After the ion implantation, the surface layer of the aluminum substrate was examined by Auger electron spectroscopy. The results are shown in FIG. 1. It is noted from FIG. 1 that the aluminum nitride layer formed on the aluminum substrate according to this invention contains substantially no oxygen (as impurities) except in the extreme surface layer. In other words, the aluminum nitride formed on the aluminum substrate is of high purity and high quality.

COMPARATIVE EXAMPLE

Figure 2:
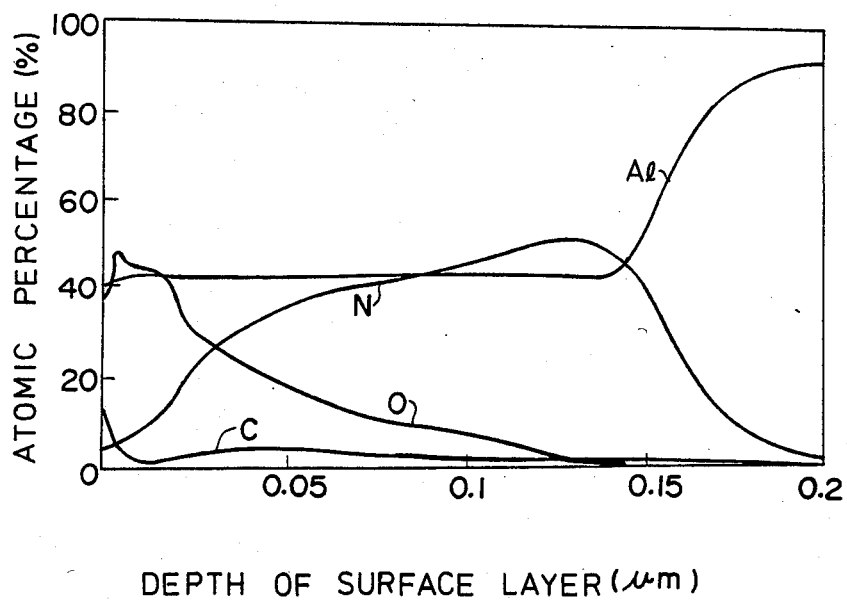
FIG. 2 is a graph similar to FIG. 1 obtained in a comparative example of this invention.

Nitrogen ion implantation was carried out for an aluminum substrate under the same conditions as in Example, except that the vacuum chamber was evacuated to $1\times10^{-6}$ Torr but no nitrogen atmosphere was formed in the vacuum chamber. The results are shown in FIG. 2. It is noted from FIG. 2 that the resulting aluminum nitride layer contains oxygen as impurities over a considerable depth. This indicates that the aluminum nitride layer is not satisfactory in quality.

What is claimed is:

1. A process for producing an aluminum material having an aluminum nitride layer on the surface thereof which comprises implanting the surface of an aluminum substrate with nitrogen ions while maintaining a nitrogen atmosphere under reduced pressure in the range of about $10^{-7}$ to $10^{-5}$ Torr in the vicinity of the surface of the aluminum substrate.

2. A process for producing an aluminum material as set forth in claim 1, wherein the accelerating energy for nitrogen ion implantation is 10 to 300 keV.

3. A process for producing an aluminum material as set forth in claim 1, wherein the accelerating energy for nitrogen ion implantation is 50 to 200 keV.

4. A process for producing an aluminum material as set forth in claim 1, wherein the amount of nitrogen ions for implantation is greater than $5\times10^{17}$ ions/cm$^2$.

5. A process for producing an aluminum material as set forth in claim 1, wherein the aluminum substrate is aluminum of single crystal.

6. A process for producing an aluminum material as set forth in claim 1, wherein the aluminum nitride layer has a thickness of 0.1 to 0.5 μm.

* * * * *